(12) United States Patent
Bae et al.

(10) Patent No.: US 11,309,205 B2
(45) Date of Patent: Apr. 19, 2022

(54) ELECTROSTATIC CHUCK AND ELECTROSTATIC ADSORPTION APPARATUS HAVING THE SAME

(71) Applicant: Samsung Display Co., Ltd., Yongin-si (KR)

(72) Inventors: Min Ho Bae, Yongin-si (KR); Hyok Keo Se Kwon, Yongin-si (KR); Tae Ho Youn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 16/591,369

(22) Filed: Oct. 2, 2019

(65) Prior Publication Data
US 2020/0126835 A1 Apr. 23, 2020

(30) Foreign Application Priority Data
Oct. 23, 2018 (KR) .......................... 10-2018-0126962

(51) Int. Cl.
*H01L 21/683* (2006.01)
*H01L 21/67* (2006.01)

(52) U.S. Cl.
CPC .... *H01L 21/6833* (2013.01); *H01L 21/67259* (2013.01)

(58) Field of Classification Search
CPC ........... H01L 21/6833; H01L 21/68757; H01L 21/67259

USPC .......................................................... 361/234
See application file for complete search history.

(56) References Cited

U.S. PATENT DOCUMENTS

| 8,081,317 B2 | 12/2011 | Kalkowski et al. | |
| 2002/0078889 A1* | 6/2002 | Welch ............... | H01L 21/67259 118/668 |
| 2016/0126125 A1* | 5/2016 | Okugawa ............ | H01L 21/6833 219/444.1 |
| 2018/0123486 A1* | 5/2018 | Bae ..................... | H01L 21/6831 |

FOREIGN PATENT DOCUMENTS

| JP | 2001-219331 A | | 8/2001 |
| JP | 2013-51358 A | | 3/2013 |
| KR | 10-0984748 B1 | | 10/2010 |
| KR | 100984748 B1 | * | 10/2010 |
| KR | 10-1829227 B1 | | 2/2018 |
| KR | 10-2018-0049855 A | | 5/2018 |

* cited by examiner

*Primary Examiner* — Kevin J Comber
(74) *Attorney, Agent, or Firm* — Lewis Roca Rothgerber Christie LLP (57) ABSTRACT

An electrostatic chuck and an electrostatic adsorption apparatus including the same are disclosed. The electrostatic chuck includes a base, a cushion layer on the base, an electrode layer on the cushion layer, and a dielectric layer on the electrode layer, the base, the cushion layer, the electrode layer, and the dielectric layer have through holes. The through holes each have a rectangular shape, and each corner region of the dielectric layer has a pair of the through holes, and the central axes of the pair of the through holes respectively intersect two adjacent sides of the dielectric layer at the respective corner region.

20 Claims, 6 Drawing Sheets

ELECTROSTATIC CHUCK AND ELECTROSTATIC ADSORPTION APPARATUS HAVING THE SAME

CROSS-REFERENCE TO RELATED APPLICATION

This application claims priority to and the benefit of Korean Patent Application No. 10-2018-0126962, filed Oct. 23, 2018, the entire content of which is incorporated herein by reference.

BACKGROUND

1. Field

Embodiments of the present disclosure relate to an electrostatic chuck and an electrostatic adsorption apparatus including the same. For example, embodiments of the present disclosure relate to an electrostatic chuck used in a manufacturing process of a semiconductor device or a display device and an electrostatic adsorption apparatus including the electrostatic chuck.

2. Discussion

In general, electrostatic chucks may be used to transfer or hold an object such as a semiconductor wafer or a glass substrate in a manufacturing process of a semiconductor device or a display device.

An electrostatic chuck is constituted such that a force of attraction is formed by potentials charged in electrodes of the electrostatic chuck and an object to be adsorbed (e.g., held by the electrostatic chuck). The force may be an electrostatic force or the like.

Because the object is adsorbed and held on a surface of an adsorbing portion of the electrostatic chuck by the electrostatic force, uniformity of the surface of the adsorbing portion and uniform distribution of the electrostatic force may be considered.

In recent years, as semiconductor wafers and display devices of various sizes are manufactured, the development of an electrostatic chuck that can be used for objects of various sizes is useful.

SUMMARY

One or more exemplary embodiments provide an electrostatic chuck capable of preventing or reducing occurrence of bubbles and an electrostatic adsorption apparatus including the same.

One or more exemplary embodiments also provide an electrostatic chuck that can be used for objects of various suitable sizes and an electrostatic adsorption apparatus including the same.

According to some exemplary embodiments, an electrostatic chuck may include a base, a cushion layer on the base, an electrode layer on the cushion layer, and a dielectric layer on the electrode layer. The base, the cushion layer, the electrode layer, and the dielectric layer may have through holes, each of the through holes may have a rectangular shape, each of the through holes has a central axis, and each corner region of the dielectric layer has a pair of the through holes, and the central axes of the pair of the through holes respectively intersect two adjacent sides of the dielectric layer at the respective corner region.

Each central axis may be parallel to two long sides of the respective through hole.

Short sides of each of the through holes may be parallel to one of the two adjacent sides at the respective corner region.

The through holes may have a width in a range of 3 mm to 4 mm.

The electrostatic chuck may be configured to adsorb an object on the dielectric layer such that two adjacent sides at each corner of the object may respectively overlap two of the through holes.

The cushion layer may have a thickness in a range of 0.2 mm to 0.3 mm.

The cushion layer may include polyethylene.

The electrode layer may include a first electrode configured to receive a first voltage and a second electrode configured to receive a second voltage different from the first voltage. The electrode layer may include one selected from copper, aluminum, gold, silver, platinum, titanium, tungsten, molybdenum, carbon nanotube, conductive polymer, and transparent conductive oxide.

The dielectric layer may include polyimide.

The electrostatic chuck may further include a transparent lens layer in each of the through holes.

The electrostatic chuck may further include an insulating layer between the cushion layer and the electrode layer.

The electrostatic chuck may further include a first adhesive layer between the cushion layer and the insulating layer, and a second adhesive layer between the electrode layer and the dielectric layer.

According to some exemplary embodiments, an electrostatic adsorption apparatus may include an electrostatic chuck having through holes, a light emitting unit on one side of the electrostatic chuck corresponding to the through holes, and a light receiving unit on an other side of the electrostatic chuck corresponding to the through holes. The electrostatic chuck may include a base, a cushion layer on the base, an electrode layer on the cushion layer, and a dielectric layer on the electrode layer. The base, the cushion layer, the electrode layer, and the dielectric layer may have the through holes, the through holes may each have a rectangular shape, and each of the through holes may have a central axis. Each corner region of the dielectric layer may have a pair of the through holes, and the central axes of the pair of the through holes may respectively intersect two adjacent sides of the dielectric layer at the respective corner region.

The light emitting unit may be configured to emit infrared light.

The light receiving unit may include an image pickup device.

Each central axis may be parallel to two long sides of the respective through hole.

Each of the through holes may have a width in a range of 3 mm to 4 mm.

The cushion layer may have a thickness in a range of 0.2 mm to 0.3 mm.

The cushion layer may include polyethylene.

BRIEF DESCRIPTION OF THE DRAWINGS

The accompanying drawings, which are included to provide a further understanding of the subject matter of the present disclosure, and are incorporated in and constitute a part of this specification, illustrate exemplary embodiments of the present disclosure, and, together with the description, serve to explain features and principles of the present disclosure.

DETAILED DESCRIPTION

Hereinafter, example embodiments of the present disclosure will be described in more detail with reference to the accompanying drawings. The following embodiments are provided so that those skilled in the art will be able to fully understand the present disclosure. The embodiments can be modified in various suitable ways. The scope of the present disclosure is not limited to the embodiments described below.

As used herein, the terms first, second, etc. are not used in a limiting sense and are used for the purpose of distinguishing one element from another. Also, an expression representing the singular may include an expression representing a plurality unless it is clearly different in context.

Also, when a layer, a region, an element, or the like is referred to as being "connected" in the embodiment, it will be understood that the layer, the region, or the element is directly or indirectly connected. For example, when a layer, a region, an element, or the like is electrically connected, the layer, the region, the element, or the like may be directly connected, or indirectly connected where another layer, region, element, or the like may be interposed therebetween.

The sizes of the elements shown in the drawings may be exaggerated or reduced for convenience of explanation. For example, the size and thickness of each element may be arbitrarily shown for convenience of explanation, and thus, the present disclosure is not necessarily limited to the embodiments shown in the drawings.

Figure 1:
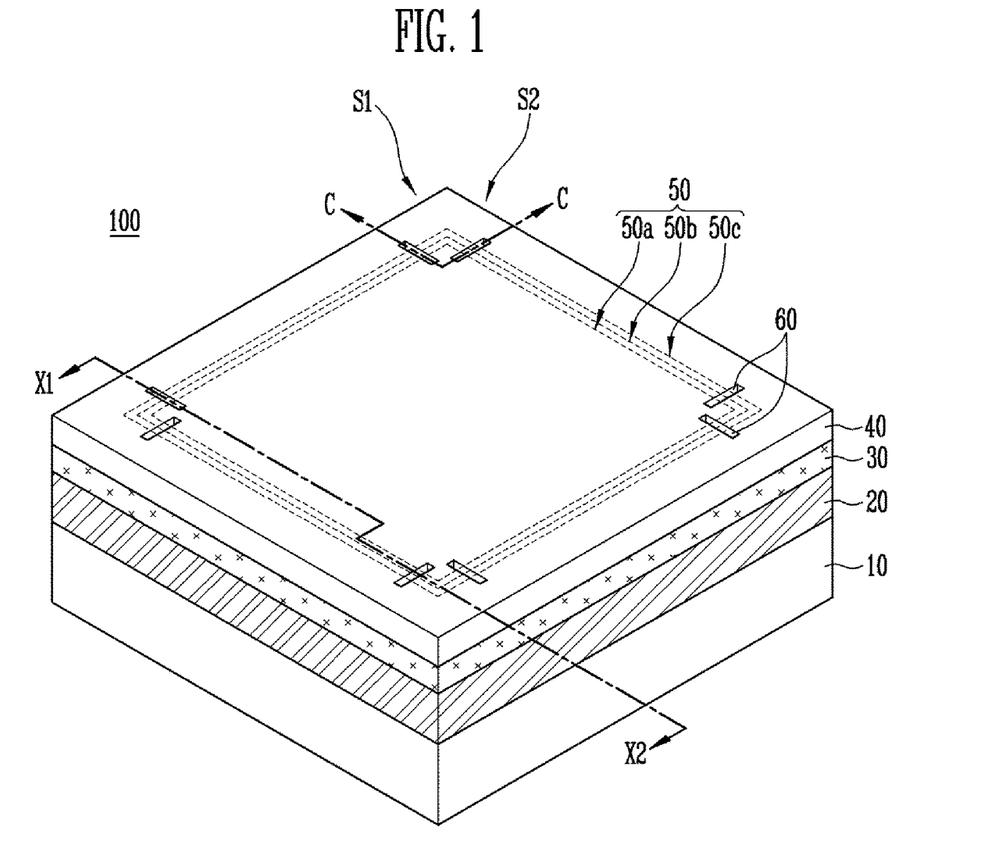
FIG. 1 is a perspective view of an electrostatic chuck according to a first embodiment of the present disclosure.
Figure 2:
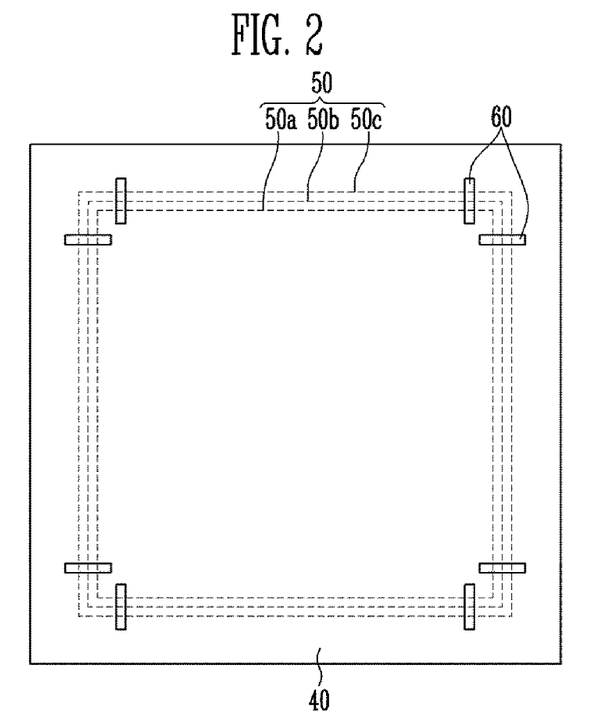
FIG. 2 is a plan view of the electrostatic chuck according to the first embodiment of the present disclosure.
Figure 3:
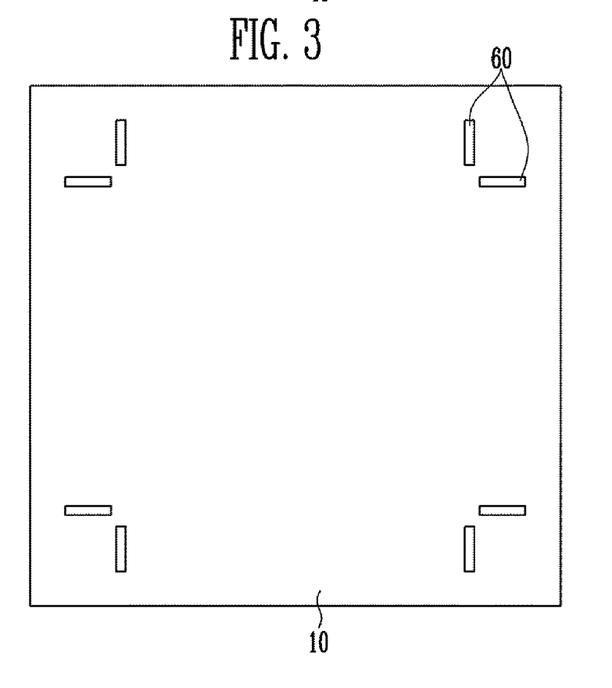
FIG. 3 is a rear view of the electrostatic chuck according to the first embodiment of the present disclosure.

FIG. 1 is a perspective view of an electrostatic chuck according to a first embodiment of the present disclosure. FIG. 2 is a plan view of the electrostatic chuck according to the first embodiment of the present disclosure. FIG. 3 is a rear view of the electrostatic chuck according to the first embodiment of the present disclosure.

In the following embodiments, an electrostatic chuck has been described as an example in which the electrostatic chuck is formed to have a rectangular shape (e.g., a substantially rectangular shape). However, a planar shape of the electrostatic chuck may be changed into various suitable shapes such as a polygon, a circle, an ellipse, a closed loop, or the like.

In addition, although an adsorbing portion of the electrostatic chuck is shown in a rectangular shape in the following embodiments, the size and shape of the adsorbing portion can be changed to correspond to the size and shape of an object to be adsorbed. For example, when edges of the object have a round shape, the adsorbing portion can be configured to correspond to the shape of the object.

Referring to FIGS. 1-3, an electrostatic chuck 100 may include a base 10 and a cushion layer 20, an electrode layer 30, and a dielectric layer 40 sequentially stacked on the base 10. The base 10, the cushion layer 20, the electrode layer 30, and the dielectric layer 40 may include through holes 60.

The base 10 may include a metal such, for example, as aluminum, iron, copper, stainless steel, and/or the like, and may be formed to be, for example, a hexahedron having a square-shaped plane.

The cushion layer 20 may include a polymer compound such as, for example polyethylene. In addition, the cushion layer 20 may have a set or predetermined thickness. For example, the cushion layer 20 may be formed to a thickness in a range of 0.2 mm to 0.3 mm.

The electrode layer 30 may include a plurality of electrodes and the plurality of electrodes may be formed of a conductive material such as, for example, copper, aluminum, gold, silver, platinum, titanium, tungsten, molybdenum, carbon nanotube, conductive polymer, and/or transparent conductive oxide.

Figure 4:
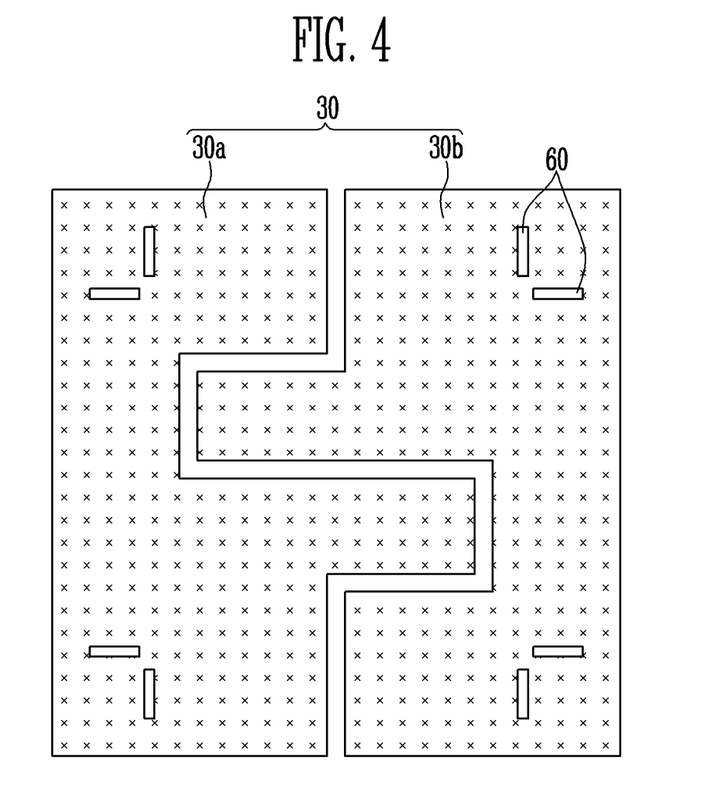
FIG. 4 is a plan view illustrating an embodiment of an electrode layer shown in FIG. 1.

FIG. 4 is a plan view illustrating an embodiment of the electrode layer 30 shown in FIG. 1.

Referring to FIG. 4, for example, the electrode layer 30 may include a first electrode 30a configured to receive a first voltage and a second electrode 30b configured to receive a second voltage different from the first voltage. The first electrode 30a and the second electrode 30b may be spaced apart from each other to be electrically isolated.

FIG. 4 illustrates a structure in which the second electrode 30b is on one side of the first electrode 30a. However, for example, the second electrode 30b may be arranged to surround the first electrode 30a.

In some embodiments, the first electrode 30a and the second electrode 30b may include terminals to which the first voltage and the second voltage are supplied from outside, respectively.

Referring to FIGS. 1-3, the dielectric layer 40 may include polyimide having excellent material properties such as, for example, heat resistance and electrical insulation.

Each of the through holes 60 may be formed of a substantially rectangular slot having two long sides facing each other and two short sides facing each other and intersecting (e.g., perpendicular or substantially perpendicular to) the two long sides.

Each of the through holes 60 may be arranged such that a central axis C parallel (e.g., substantially parallel) to the two long sides intersects two adjacent sides S1 and S2 at each corner region (e.g., corner) or the two short sides are parallel (e.g., substantially parallel) to the two adjacent sides S1 and S2 at each corner region. Here, each corner region may indicate an edge of each of the four corners of the electrostatic chuck 100. However, each corner region may indicate an edge of each of the four corners of each of the base 10, the cushion layer 20, the electrode layer 30, and the dielectric layer 40.

Figure 5:
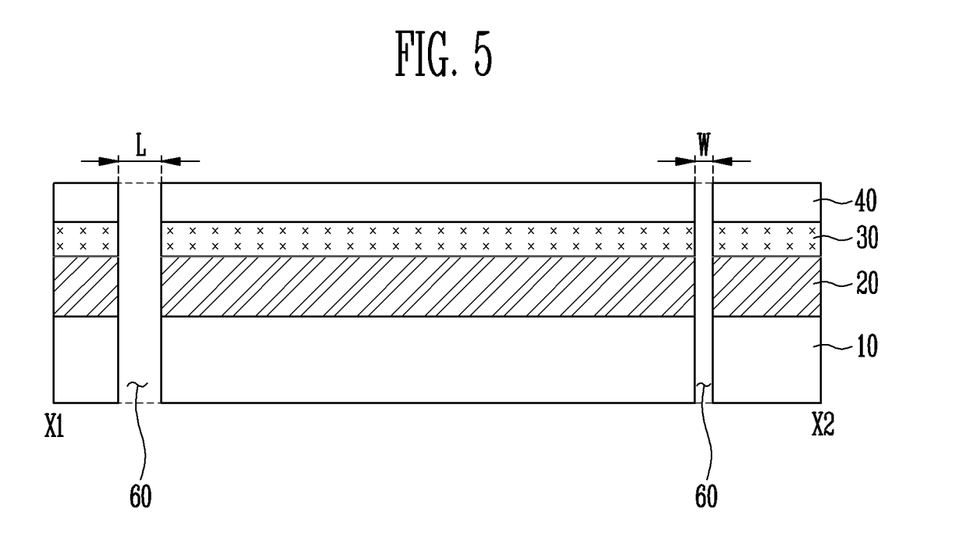
FIG. 5 is a cross-sectional view taken along line X1-X2 of FIG. 1.

FIG. 5 is a cross-sectional view taken along line X1-X2 of FIG. 1. The through holes 60 may be formed to have a width W in a range of about 3 mm to 4 mm. In addition, a length L of the through holes 60 may be determined corresponding to a size of an adsorbing portion 50 where an object is adsorbed.

Referring to FIGS. 1-5, the length L of the through holes 60 may be determined so as to correspond to adsorbing portions 50*a*, 50*b*, and 50*c* of various sizes. For example, each side of objects of various suitable sizes can be overlapped with the through holes 60.

A positive (+) voltage as the first voltage may be applied to the first electrode 30*a* and a negative (−) voltage as the second voltage may be applied to the second electrode 30*b* in a state where the adsorbing portion 50 of the electrostatic chuck 100 is positioned so as to correspond to an object to be adsorbed. Electrostatic force is generated by charging the object corresponding to the first electrode 30*a* and the second electrode 30*b* with opposite potentials, whereby the object can be adsorbed to the adsorbing portion 50 of the electrostatic chuck 100.

The electrostatic chuck 100 constructed as described herein above can be used in an electrostatic adsorption apparatus.

Figure 6:
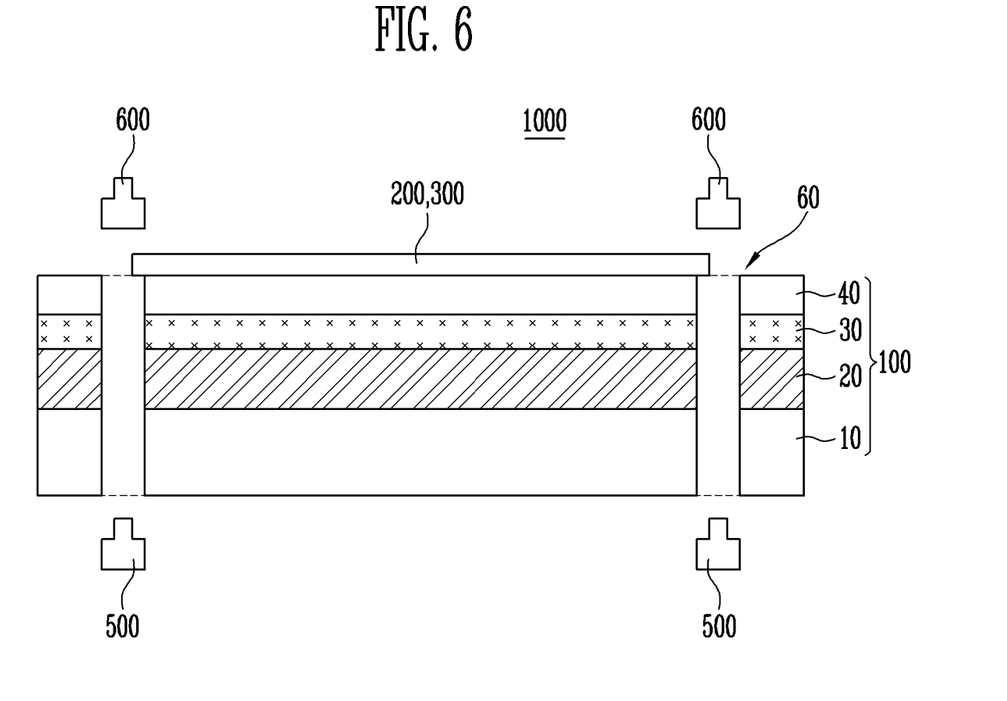
FIG. 6 is a cross-sectional view of an electrostatic adsorption apparatus according to an embodiment of the present disclosure.

FIG. 6 is a cross-sectional view of an electrostatic adsorption apparatus according to an embodiment of the present disclosure.

Referring to FIG. 6, an electrostatic adsorption apparatus 1000 may have the electrostatic chuck 100 including the through holes 60 described with reference to FIGS. 1-5, a light emitting unit 500 on one side of the electrostatic chuck 100 corresponding to the through holes 60, and a light receiving unit 600 on the other side of the electrostatic chuck 100 corresponding to the through holes 60.

The light emitting unit 500 may include a light bulb, a light emitting diode (LED), or a laser generator as a light source configured to emit light such as, for example, visible light, infrared light (e.g., infrared radiation or infrared rays), and/or a laser beam.

The light receiving unit 600 may receive the light irradiated through the through holes 60 from the light emitting unit 500 and sense a position of the object. The light receiving unit 600 may include, for example, an image pickup device. For example, the light receiving unit 600 may include a camera.

In some embodiments, the electrostatic adsorption apparatus 1000 may further include a transfer unit configured to sequentially move the light emitting unit 500 and the light receiving unit 600 to positions corresponding to the through holes 60.

The light emitting unit 500 and the light receiving unit 600 may be sequentially moved to the positions corresponding to the through holes 60 by the transfer unit in a state where an object 200 or 300 is adsorbed to the adsorbing portion 50 of the electrostatic chuck 100.

When the light emitting unit 500 emits light to the through holes 60, the light receiving unit 600 receives the light and senses a position of the object 200 or 300. For example, the position of the object 200 or 300 may be sensed by distinguishing a position of an edge of the object 200 or 300 in the through holes 60, or an area through which the light is transmitted and an area through which the light is not transmitted in the through holes 60. A degree of alignment of the object 200 or 300 may be confirmed using the position of the object 200 or 300.

The above described operations may be performed by a control unit that controls the light emitting unit 500, the light receiving unit 600, and the transfer unit. The control unit may include a set or predetermined processing unit.

Figure 7:
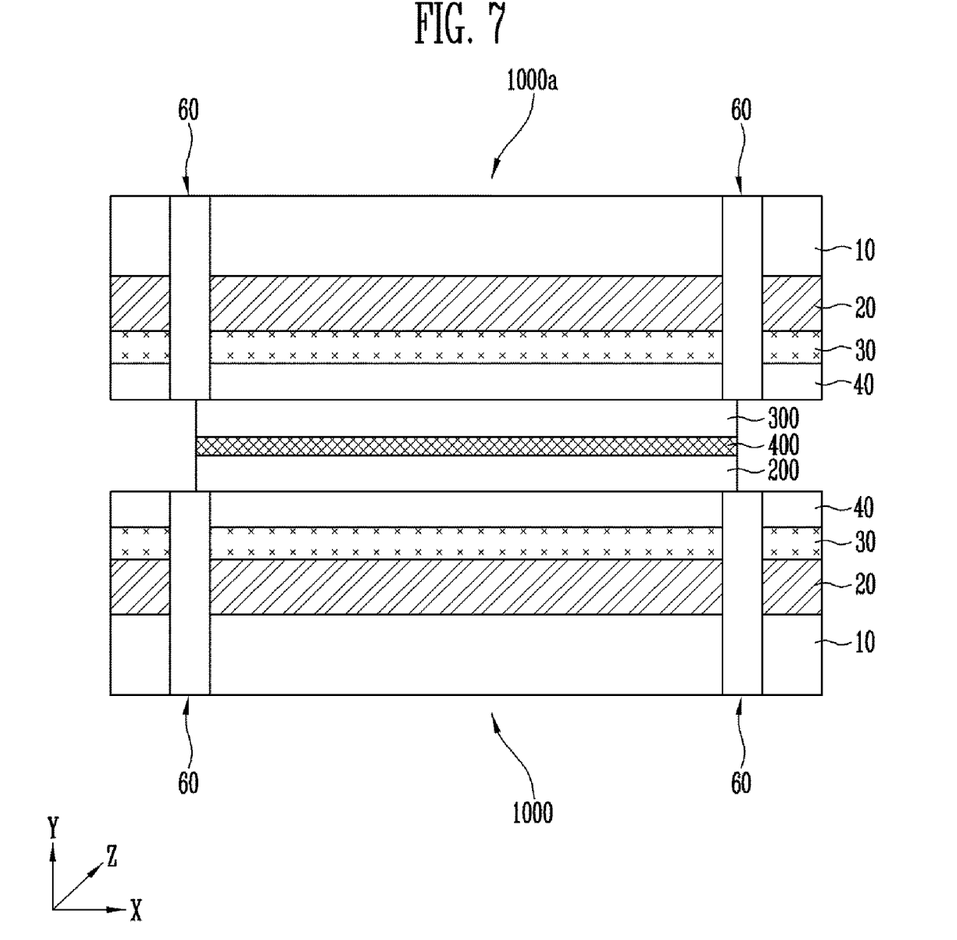
FIG. 7 is a cross-sectional view illustrating an embodiment of a process of attaching objects to each other using the electrostatic adsorption apparatus of FIG. 6.

FIG. 7 is a cross-sectional view illustrating an embodiment of a process of attaching objects 200 and 300 to each other using the electrostatic adsorption apparatus 1000 of FIG. 6.

Referring to FIGS. 6 and 7, two electrostatic adsorption apparatuses 1000 and 1000*a* are at lower and upper portions so as to face each other. For example, an upper electrostatic adsorption apparatus 1000*a* may be fixed and a lower electrostatic adsorption apparatus 1000 may be movable in a horizontal direction (for example, X axis and Z axis directions) and a vertical direction (for example, Y direction).

A glass substrate 200 of a display panel may be adsorbed on the electrostatic chuck 100 of the lower electrostatic adsorption apparatus 1000 and a window member 300 may be adsorbed on the electrostatic chuck 100 of the upper electrostatic adsorption apparatus 1000*a*.

Degrees of alignment of the glass substrate 200 and the window member 300 may be confirmed in the upper electrostatic adsorption apparatus 1000*a* and the lower electrostatic adsorption apparatus 1000, respectively, as described with reference to FIG. 6. At this time, the lower electrostatic adsorption apparatus 1000 may be moved by the control unit to correct a misalignment, or the glass substrate 200 and the window member 300 may be aligned to face each other.

A transparent optical adhesive layer 400 may be interposed between the glass substrate 200 and the window member 300. The optical adhesive layer 400 may include an optically clear resin (OCR) or an optically clear adhesive (OCA).

The lower electrostatic adsorption apparatus 1000 moves upward in the vertical direction (Y axis direction) and is closely contacted to the upper electrostatic adsorption apparatus 1000*a* so that the window member 300 is in contact with the glass substrate 200 through the optical adhesive layer 400.

At this time, corner edges of the glass substrate 200 and the window member 300 overlap the through holes 60. Because insides of the through holes 60 are empty, adhesion force or pressing force at this portion can be lower than other portions. Bubbles may occur between the window member 300 and the glass substrate 200 due to such a difference in the adhesion force or the pressing force.

The OCA used as the optical adhesive layer 400 requires a pressing force which is about 5 to 6 times greater than that of the OCR. When the pressing force is increased, bubbles in a portion of the through holes 60 are inevitably further increased.

The electrostatic chuck 100 according to the embodiment of the present disclosure may have the through holes 60 having a width W in a range of about 3 mm to 4 mm.

The width W of the through holes 60 can be minimized or reduced to minimize or reduce the difference in the pressing force, thereby minimizing, preventing, or reducing occurrence of bubbles. A certain amount of bubbles may be completely removed through subsequent processing at a set or predetermined pressure and temperature.

When the width W of the through holes 60 is reduced to 3 mm or less, light provided from the light emitting unit 500 is not smoothly transmitted to the light receiving unit 600 and a region for sensing a position of the object on the light receiving unit 600 is not suitably or sufficiently secured. In addition, when the width W of the through holes 60 is increased to 4 mm or more, the occurrence of bubbles due to the difference in the pressing force as described above becomes inevitable or unavoidable.

The electrostatic chuck 100 according to the embodiment of the present disclosure may also have the through holes 60 arranged so that the central axis C parallel (e.g., substantially parallel) to the two long sides intersects the two adjacent sides S1 and S2 at each corner region of the electrostatic chuck 100.

When the length L of the through holes 60 is adjusted to correspond to the adsorbing portions 50a, 50b and 50c of various suitable sizes, one electrostatic chuck 100 can be used for objects of various suitable sizes.

For example, the through holes 60 can be arranged such that the central axis C parallel (e.g., substantially parallel) to the two longer sides of each of the through holes 60 is parallel (e.g., substantially parallel) to the two adjacent sides S1 and S2 at each corner of the electrostatic chuck 100. In this case, the occurrence of bubbles can be prevented or reduced, but the electrostatic chuck 100 can only be used for a single-sized object.

In addition, the electrostatic chuck 100 according to the embodiment of the present disclosure may have the cushion layer 20 comprising polyethylene having a thickness in a range of 0.2 mm to 0.3 mm.

Due to the material and thickness of the cushion layer 20, the cushion layer 20 has a lower hardness than, for example, acrylic, so that an amount to be pressed can be minimized or reduced and a restoring force can be maximized or increased.

The cushion layer 20 functions as a buffer layer which can be pressed and restored to a set or predetermined level. The pressing force may be uniformly (e.g., substantially uniformly) transmitted by the cushion layer 20 over an entire surface (e.g., substantially an entire surface) of the object to thereby reduce or prevent deformation or breakage of the object.

When the thickness of the cushion layer 20 is reduced to 0.2 mm or less, a buffering effect may be decreased. On the contrary, when the thickness of the cushion layer 20 is increased to 0.3 mm or more, the amount to be pressed increases and the restoring force decreases, which may cause the occurrence of bubbles when the objects of various suitable sizes are adsorbed.

In the electrostatic chuck 100 according to an embodiment of the present disclosure, the through holes 60 are formed to penetrate the base 10, the cushion layer 20, the electrode layer 30 and the dielectric layer 40. Therefore, the material and thickness of the cushion layer 20 can be easily selected and changed as required. For example, as the material of the cushion layer 20, a colored material such as black or white may be used.

Figure 8:
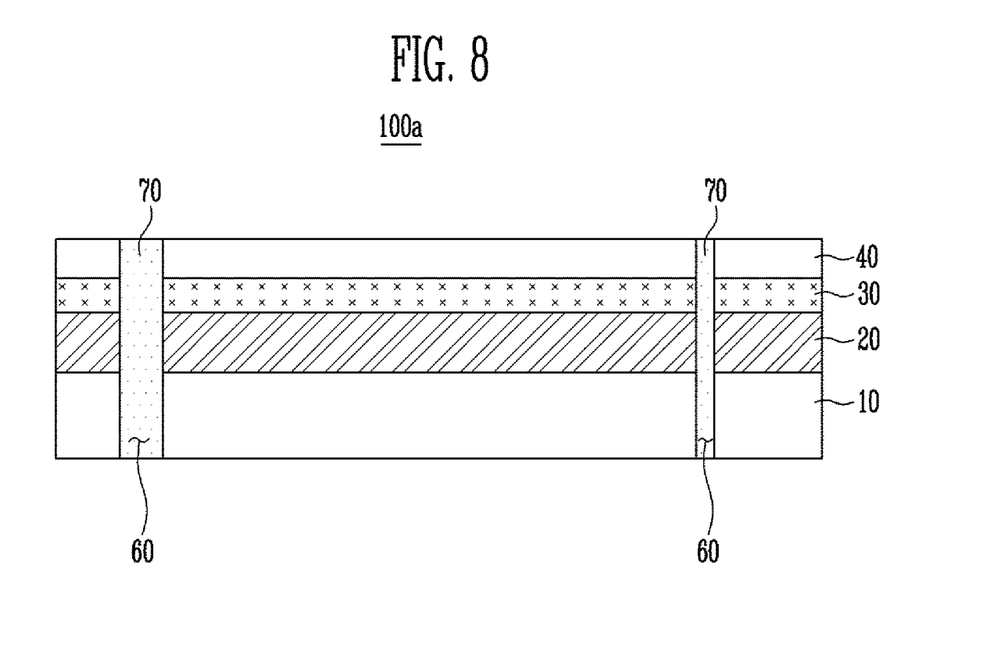
FIG. 8 is a cross-sectional view of an electrostatic chuck according to a second embodiment of the present disclosure.

FIG. 8 is a cross-sectional view of an electrostatic chuck according to a second embodiment of the present disclosure.

An electrostatic chuck 100a of the second embodiment is similar to the electrostatic chuck 100 of the first embodiment except for a lens layer 70.

The electrostatic chuck 100a of the second embodiment may further include a transparent lens layer 70 filled in each of the through holes 60. The lens layer 70 may be formed of silicone and/or the like having a shore-C hardness of about 85.5.

Although a structure in which the lens layer 70 is filled in the through holes 60 is shown in FIG. 8, in another embodiment, a position of the lens layer 70 in the through holes 60 may be changed by an adjusting unit.

In the electrostatic chuck 100a of the second embodiment, the difference in the pressing force at the portion of the through holes 60 is compensated for by the lens layer 70 filled in the through holes 60, so that the effect of preventing or reducing the occurrence of bubbles can be further maximized or increased.

In addition, when the position of the lens layer 70 is changed by the adjusting unit, because a surface of the lens layer 70 can be precisely aligned with a surface of the dielectric layer 40, the effect of preventing or reducing the occurrence of bubbles can be further maximized or increased.

Figure 9:
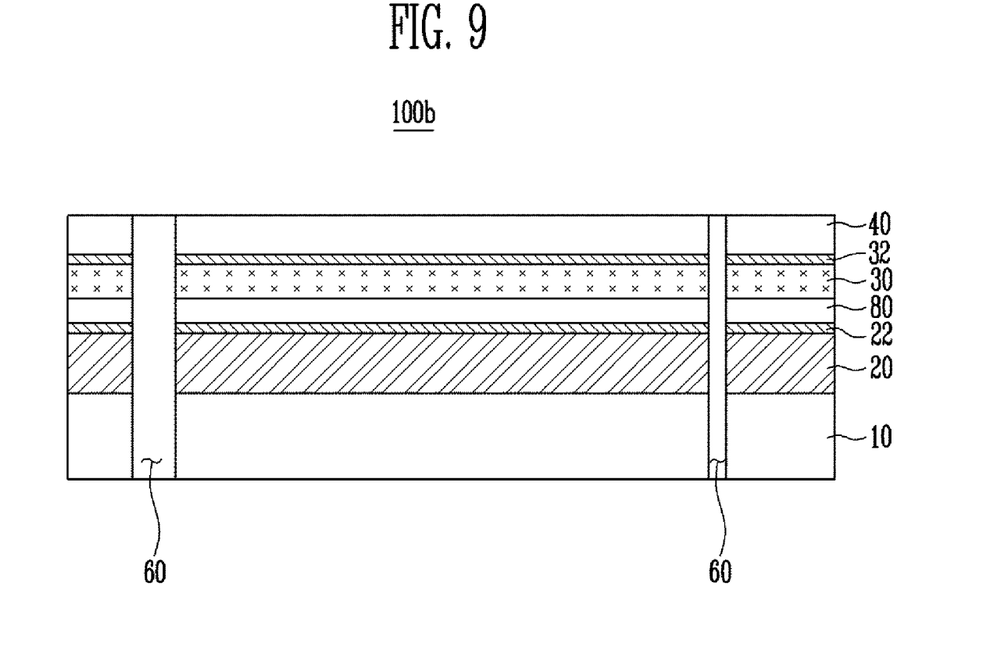
FIG. 9 is a cross-sectional view of an electrostatic chuck according to a third embodiment of the present disclosure.

FIG. 9 is a cross-sectional view of an electrostatic chuck according to a third embodiment of the present disclosure.

An electrostatic chuck 100b of the third embodiment is similar to the electrostatic chuck 100 of the first embodiment except for an insulating layer 80 and a first adhesive layer 22 and a second adhesive layer 32.

The electrostatic chuck 100b of the third embodiment may include the insulating layer 80 interposed between the cushion layer 20 and the electrode layer 30.

As shown in FIG. 7, when a set or predetermined pressing force is repeatedly applied to the electrode layer 30 of each electrostatic chuck 100 during the process of attaching the objects 200 and 300 to each other, damage or short-circuiting of the electrode layer 30 may occur.

The insulating layer 80 may include polyimide as a protective layer for preventing or reducing the damage of the electrode layer 30 due to the pressing force in the process of attaching the objects 200 and 300.

In addition, the electrostatic chuck 100b of the third embodiment may further include the first adhesive layer 22 for maintaining an adhesive force between the cushion layer 20 and the insulating layer 80 and the second adhesive layer 32 for maintaining an adhesive force between the electrode layer 30 and the dielectric layer 40. The first adhesive layer 22 and the second adhesive layer 32 may include a polymeric material.

Because the adhesive forces between the cushion layer 20, the insulating layer 80, the electrode layer 30 and the dielectric layer 40 can be maintained by the first adhesive layer 22 and the second adhesive layer 32, deterioration of durability of the electrostatic chuck 100b due to repeated use of the electrostatic chuck 100b can be effectively prevented or reduced.

As described above, the electrostatic chuck according to the embodiment of the present disclosure includes the through holes having a rectangular shape (e.g., a substantially rectangular shape), and the through holes are arranged so that a central axis of each of the through holes intersects two adjacent sides at each corner region of the electrostatic chuck. The shape of the through holes may prevent or reduce the occurrence of bubbles at corner portions, and the arrangement structure of the through holes may allow one electrostatic chuck to be used for the objects of various suitable sizes.

When the electrostatic adsorption apparatus including the electrostatic chuck according to the embodiment of the present disclosure is used in a manufacturing process of a display device, defective display devices can be effectively prevented or reduced.

It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of,"

when preceding a list of elements, modify the entire list of elements and do not modify the individual elements of the list.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As described herein above, example embodiments of the present disclosure have been disclosed through the detailed description and the drawings. It is to be understood that the terminology used herein is for the purpose of describing the present disclosure only and is not used to limit the scope of the subject matter described in the claims. Therefore, those skilled in the art will appreciate that various modifications and equivalent embodiments are possible without departing from the spirit scope of the present disclosure. Accordingly, the true scope of the present disclosure should be determined by the appended claims, and equivalents thereof.

What is claimed is:

1. An electrostatic chuck comprising:
a base;
a cushion layer on the base;
an electrode layer on the cushion layer; and
a dielectric layer on the electrode layer,
wherein the base, the cushion layer, the electrode layer, and the dielectric layer have through holes, the through holes each have a rectangular shape, and each of the through holes has a central axis, and
wherein each corner region of the dielectric layer has a pair of the through holes, and the central axes of the pair of the through holes respectively intersect two adjacent sides of the dielectric layer at the respective corner region.

2. The electrostatic chuck of claim 1, wherein each central axis is parallel to two long sides of the respective through hole.

3. The electrostatic chuck of claim 2, wherein short sides of each of the through holes are parallel to one of the two adjacent sides at the respective corner region.

4. The electrostatic chuck of claim 1, wherein each of the through holes has a width in a range of 3 mm to 4 mm.

5. The electrostatic chuck of claim 1, wherein the electrostatic chuck is configured to adsorb an object on the dielectric layer such that two adjacent sides at each corner of the object respectively overlap two of the through holes.

6. The electrostatic chuck of claim 1, wherein the cushion layer has a thickness in a range of 0.2 mm to 0.3 mm.

7. The electrostatic chuck of claim 6, wherein the cushion layer comprises polyethylene.

8. The electrostatic chuck of claim 1, wherein the electrode layer comprises:
a first electrode configured to receive a first voltage; and
a second electrode configured to receive a second voltage different from the first voltage.

9. The electrostatic chuck of claim 1, wherein the electrode layer comprises one selected from copper, aluminum, gold, silver, platinum, titanium, tungsten, molybdenum, carbon nanotube, conductive polymer, and transparent conductive oxide.

10. The electrostatic chuck of claim 1, wherein the dielectric layer comprises polyimide.

11. The electrostatic chuck of claim 1, further comprising:
a transparent lens layer in each of the through holes.

12. The electrostatic chuck of claim 1, further comprising:
an insulating layer between the cushion layer and the electrode layer.

13. The electrostatic chuck of claim 12, further comprising:
a first adhesive layer between the cushion layer and the insulating layer; and
a second adhesive layer between the electrode layer and the dielectric layer.

14. An electrostatic adsorption apparatus, the apparatus comprising:
an electrostatic chuck having through holes;
a light emitting unit on one side of the electrostatic chuck corresponding to the through holes; and
a light receiving unit on an other side of the electrostatic chuck corresponding to the through holes,
wherein the electrostatic chuck comprises:
a base;
a cushion layer on the base;
an electrode layer on the cushion layer; and
a dielectric layer on the electrode layer,
wherein the base, the cushion layer, the electrode layer, and the dielectric layer have the through holes, the through holes each have a rectangular shape, and each of the through holes has a central axis, and
wherein each corner region of the dielectric layer has a pair of the through holes, and the central axes of the pair of the through holes respectively intersect two adjacent sides of the dielectric layer at the respective corner region.

15. The apparatus of claim 14, wherein the light emitting unit is configured to emit infrared light.

16. The apparatus of claim 14, wherein the light receiving unit comprises an image pickup device.

17. The apparatus of claim 14, wherein each central axis is parallel to two long sides of the respective through hole.

18. The apparatus of claim 14, wherein each of the through holes has a width in a range of 3 mm to 4 mm.

19. The apparatus of claim 14, wherein the cushion layer has a thickness in a range of 0.2 mm to 0.3 mm.

20. The apparatus of claim 19, wherein the cushion layer comprises polyethylene.

* * * * *